United States Patent
Rolandi et al.

[11] Patent Number: 6,009,041
[45] Date of Patent: Dec. 28, 1999

[54] METHOD AND CIRCUIT FOR TRIMMING THE INTERNAL TIMING CONDITIONS OF A SEMICONDUCTOR MEMORY DEVICE

[75] Inventors: Paolo Rolandi, Voghera; Antonio Barcella, Trescore Balneario; Marco Fontana, Milan; Massimo Montanaro, Pavia, all of Italy

[73] Assignee: SGS-Thomson Microelectronics S.r.l., Agrate Brianza, Italy

[21] Appl. No.: 09/032,272

[22] Filed: Feb. 26, 1998

[51] Int. Cl.[6] .................................................. G11C 8/00
[52] U.S. Cl. .................. 365/233.5; 365/233; 365/230.08
[58] Field of Search ................................ 365/233.5, 233, 365/230.08

[56] References Cited

U.S. PATENT DOCUMENTS

| | | | |
|---|---|---|---|
| 5,056,064 | 10/1991 | Iwahashi et al. | 365/233.5 |
| 5,444,666 | 8/1995 | Oh | 365/230.08 |
| 5,668,949 | 3/1999 | Villa et al. | 365/233.5 |
| 5,883,854 | 3/1999 | Becker | 365/233.5 |
| 5,889,728 | 3/1999 | Rezeanu | 365/233.5 |
| 5,923,610 | 7/1999 | Te | 365/233.5 |

*Primary Examiner*—David Nelms
*Assistant Examiner*—Tuan T. Nguyen
*Attorney, Agent, or Firm*—Jenkens & Gilchrist, P.C.

[57] ABSTRACT

A method and circuit to trim the internal timing conditions for a semiconductor memory device including a memory matrix and circuit portions for allowing reading of the data stored in the memory matrix wherein such circuit portions include an ATD generator detecting each transition of a plurality of address terminals of the memory device to produce an ATD synchronization signal, a sense amplifier which receives an equalization a signal EQU from a generator activated by the ATD signal, and output buffers enabled by an OUTLATCH signal produced by a generator receiving the ATD signal and the EQU signal. The length of the signals is automatically trimmed according to a corresponding length code contained in a portion of the memory device.

27 Claims, 7 Drawing Sheets

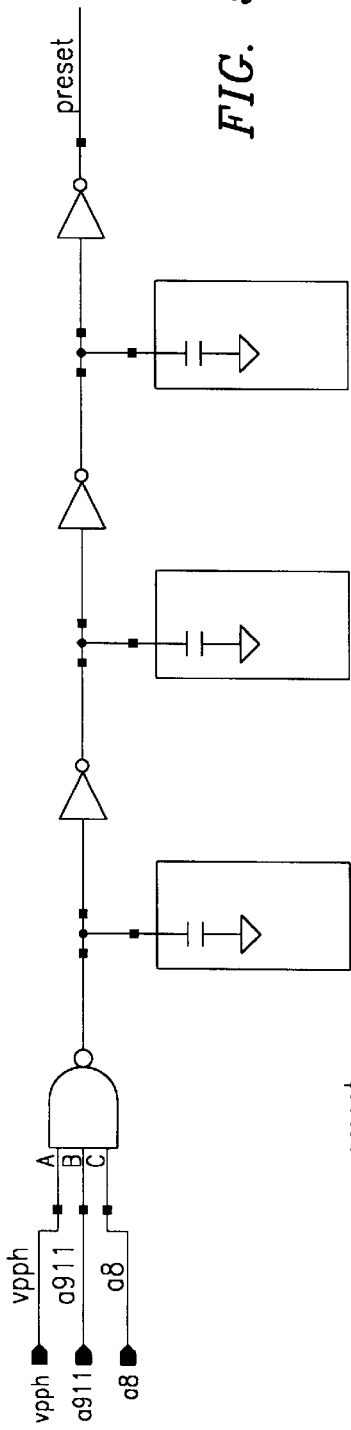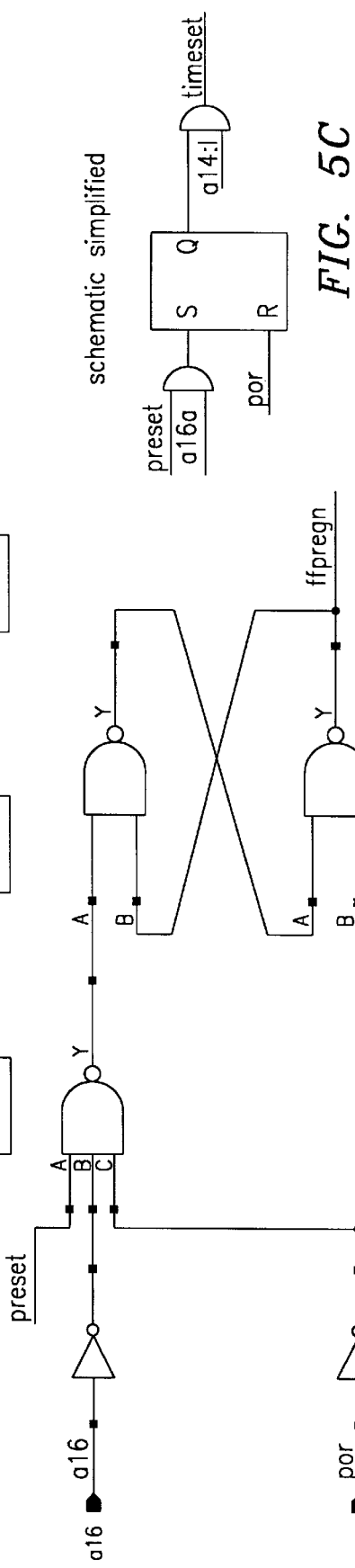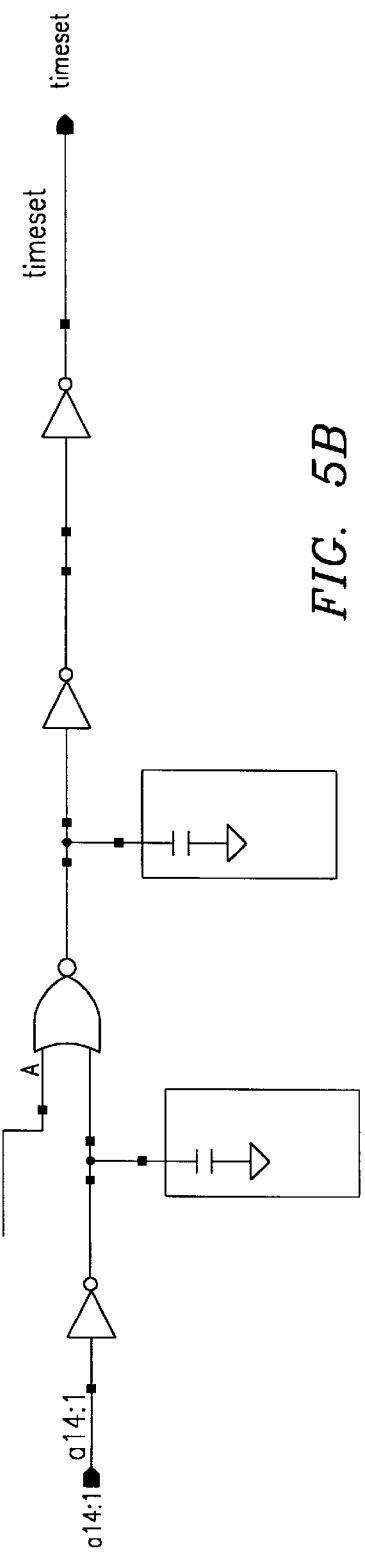
FIG. 5
FIG. 5C
FIG. 5A
FIG. 5B

METHOD AND CIRCUIT FOR TRIMMING THE INTERNAL TIMING CONDITIONS OF A SEMICONDUCTOR MEMORY DEVICE

TECHNICAL FIELD OF THE INVENTION

The present invention relates to a method and circuit to detect the best timing conditions for a semiconductor memory device and to trim such internal timing.

BACKGROUND OF THE INVENTION

As is well known, semiconductor memory devices such as MaskROM, EPROM, EEPROM, FLASH, SRAM and DRAM have reached such large density and capacity to store logic information (up to 64 Mbit on a single chip) to require additional circuit portions for managing and synchronizing the different timing activities of the device. For instance, one of these circuit portions is the well known ATD (Address Transition Detection) circuit which is active to synchronize the reading phase of the memory data. The ATD circuit detects each transition on the address or CE terminals or pins of the memory device and generates a synchronization signal which is used for timing many operating functions of the memory device. One of these operating functions is the precharge phase of the memory bit lines which must be charged to a predetermined logic level to allow a good conduction of the memory cell storing the data to be read.

For a EPROM device the bit lines are usually precharged to 1 V, while for a RAM device the bit lines are usually precharged to 5 V. The timing setting provided by the ATD circuit is used also to enable the output data buffer as soon as the sensing amplifier has detected the logic information of the memory cell. Therefore, the detection of an address transition, the sensing of the memory cell and the output presentation of the stored data are all operations which must be synchronized and/or delayed according to the kind and size of the memory device and the technology used. The timing schedule of the memory device must be designed carefully and this design activity can become very hard for the memory device designer.

Prior Art

A known prior art solution is disclosed in the U.S. Pat. No. 5,444,666 assigned to Huyndai. This document discloses a circuit and method allowing the memory device designer to set up the timing schedule of the device. However, this solution has been specifically provided for synchronizing the redundancy circuit portion of the memory device.

SUMMARY OF THE INVENTION

One object of the present invention is to provide a method and circuit to detect the best timing conditions for a semiconductor memory device and to design the memory device according to such best conditions.

Another object of the present invention is automatic trimming of the timing activity of the memory device, that is: automatically defining the time intervals of the synchronization signals inside the memory device.

A further object of the present invention is to speed up the design phase of the memory device by allowing an automatic timing trimming which optimize the performance of the memory device.

Accordingly, the present invention provides a method to trim the internal timing conditions for a semiconductor memory device including a memory matrix and circuit portions for allowing reading of the data stored in the memory matrix. The circuit portions include an ATD generator detecting each transition of a plurality of address terminals of the memory device to produce an ATD synchronization signal, a sense amplifier which receives an equalization signal EQU from a generator activated by said ATD signal, and output buffers enabled by an OUTLATCH signal produced by a generator receiving said ATD signal and said EQU signal. The timing of the signals is automatically trimmed according to a corresponding code contained in the memory device.

The present invention also provides a circuit for detecting the optimal timing conditions for a semiconductor memory device which comprises a memory matrix and circuit portions for allowing reading of the data stored in the memory matrix. The circuit portions include an ATD generator detecting each transition of a plurality of address terminals of the memory device to produce an ATD synchronization signal, a sense amplifier which receives an equalization signal EQU from a generator activated by said ATD signal, and output buffers enabled by an OUTLATCH signal produced by a generator receiving said ATD signal. The memory device includes a latch configured to store the length of the signals so as to automatically trim the signal according to a length code contained in the latch.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

Further features and advantages of the inventive method and circuit will appear from the following description given by way of non-limiting example with reference to the annexed drawings.

FIGS. 4–8 are circuit portions of the memory device according to the present invention.

DETAILED DESCRIPTION OF A PREFERRED EMBODIMENT OF THE INVENTION

In general, the present invention provides a method and circuit to trim the internal timing conditions for a semiconductor memory device which comprises a memory matrix and circuit portions for allowing reading of the data stored in the memory matrix.

Figure 1:
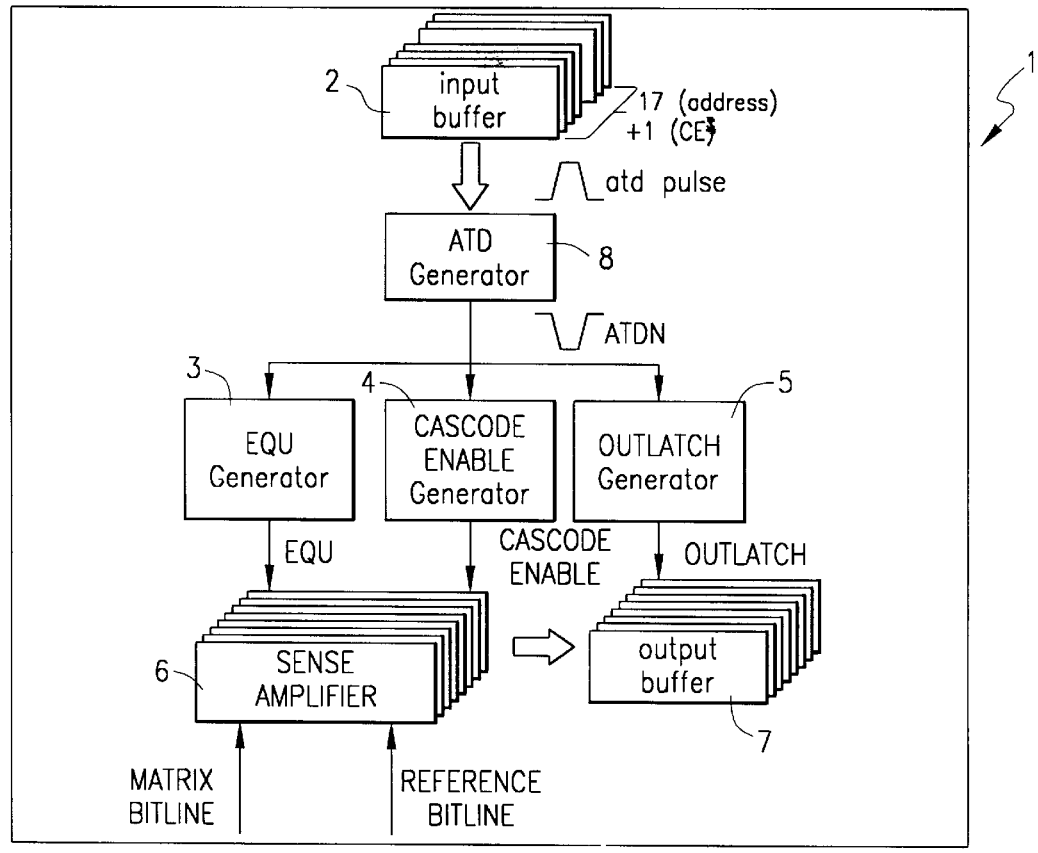
FIG. 1 shows a schematic block view of circuit portions involved in the timing activity of a semiconductor memory device according to the present invention.
Figure 2:
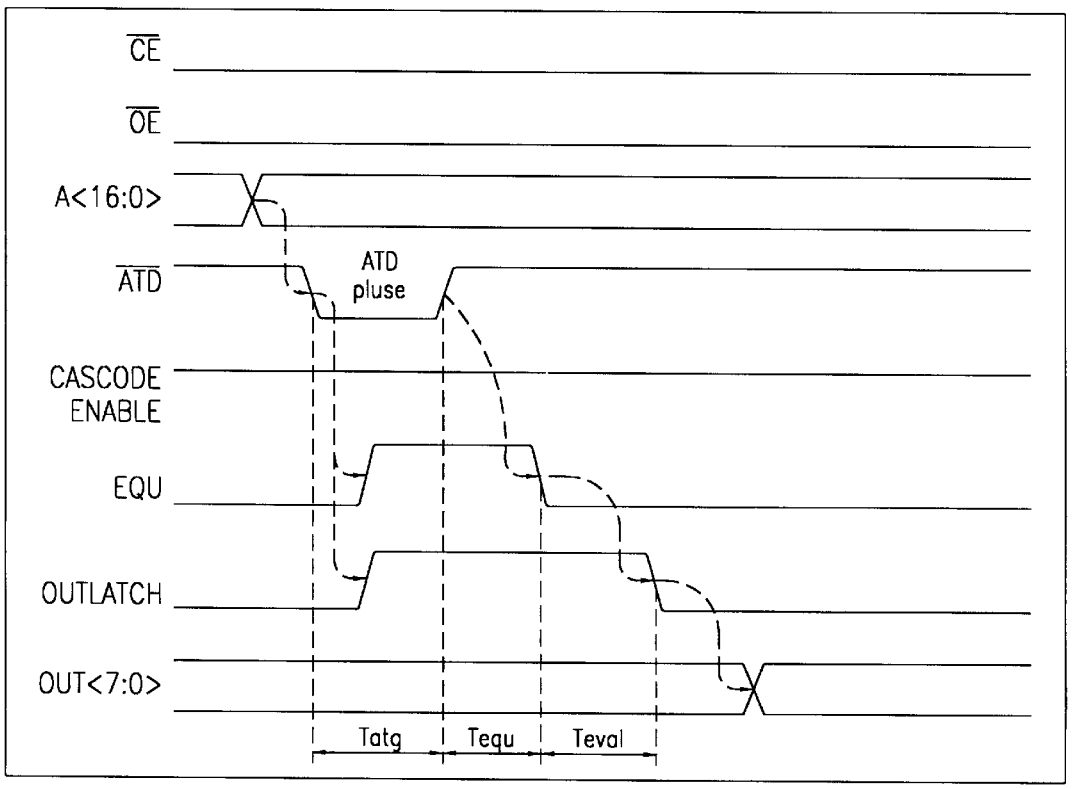
FIG. 2 is a timing diagram showing a plurality of different logic signals having the same time base and which are outstanding during a reading cycle of a memory device according to the present invention.

With reference to FIG. 1, a memory circuit device which is preferably integrated on a semiconductor substrate is shown. The memory device 1 may be one of the known kind of semiconductor memory chips such as: MaskROM, EPROM, EEPROM, FLASH, SRAM or DRAM. Just as an example, the memory device 1 may be a 1 Mbit Flash EPROM having a memory word of eight bits.

In any case, the memory device 1 comprises a plurality of input address buffers 2 for a corresponding plurality of input address terminals or pins. In this example we will take in consideration a number of seventeen address terminals and one CE terminal.

All the outputs of the input address buffers 2 are connected to an ATD circuit generator 8 which detects an ATD pulse from the address terminals and generates a synchronization signal ATDN which drives all the other circuit portions involved with the reading phase of the memory device. Those circuit portions are: a generator 3 for the equalization phase of the sense amplifier; a cascode enable generator 4 and an outlatch generator 5. Each generator 3, 4 or 5 is enabled by the signal ATDN to generate local signals EQU, CASCODE ENABLE and OUTLATCH respectively.

The corresponding outputs of the first two generators 3 and 4 are addressed to a sense amplifier circuit 6 which includes a sense amplifier for each bit of the memory word; that is the number of sense amplifiers corresponds to the number of the output buffers 7.

The signal EQU is used for precharging the bit lines of the memory device and for enabling the equalization phase of the sense amplifiers. On the falling edge of the EQU signal the read data is transferred to the output buffers. The OUTLATCH signal allows the outputs to keep the data coming out from the previous reading phase.

Now, according to the present invention a timing trimming of the whole reading phase is provided in order to regulate the length of each phase of the reading cycle. In other words, the detection of an address transition, the sensing of the memory cell and the output presentation of the stored data are all operations which are synchronized according to the invention in a trimming way.

The length of the ATD pulse is coded by four bits, three bits for defining a default or coarse value and one bit for a fine adjustment. The length of the other synchronized signals, such as the EQU signal and the OUTLATCH signal is coded too. For instance, three bits may be used to code the length of the EQU signal. Those coding bits may be stored into a latch which may be obtained from a small portion of the memory device.

If the memory device is considered as including a memory matrix of cells each of which is identified by the intersection of a matrix column with a matrix row, the latch storing the coding of the above synchronization signals may be identified by a row portion of the memory matrix.

Figure 3:
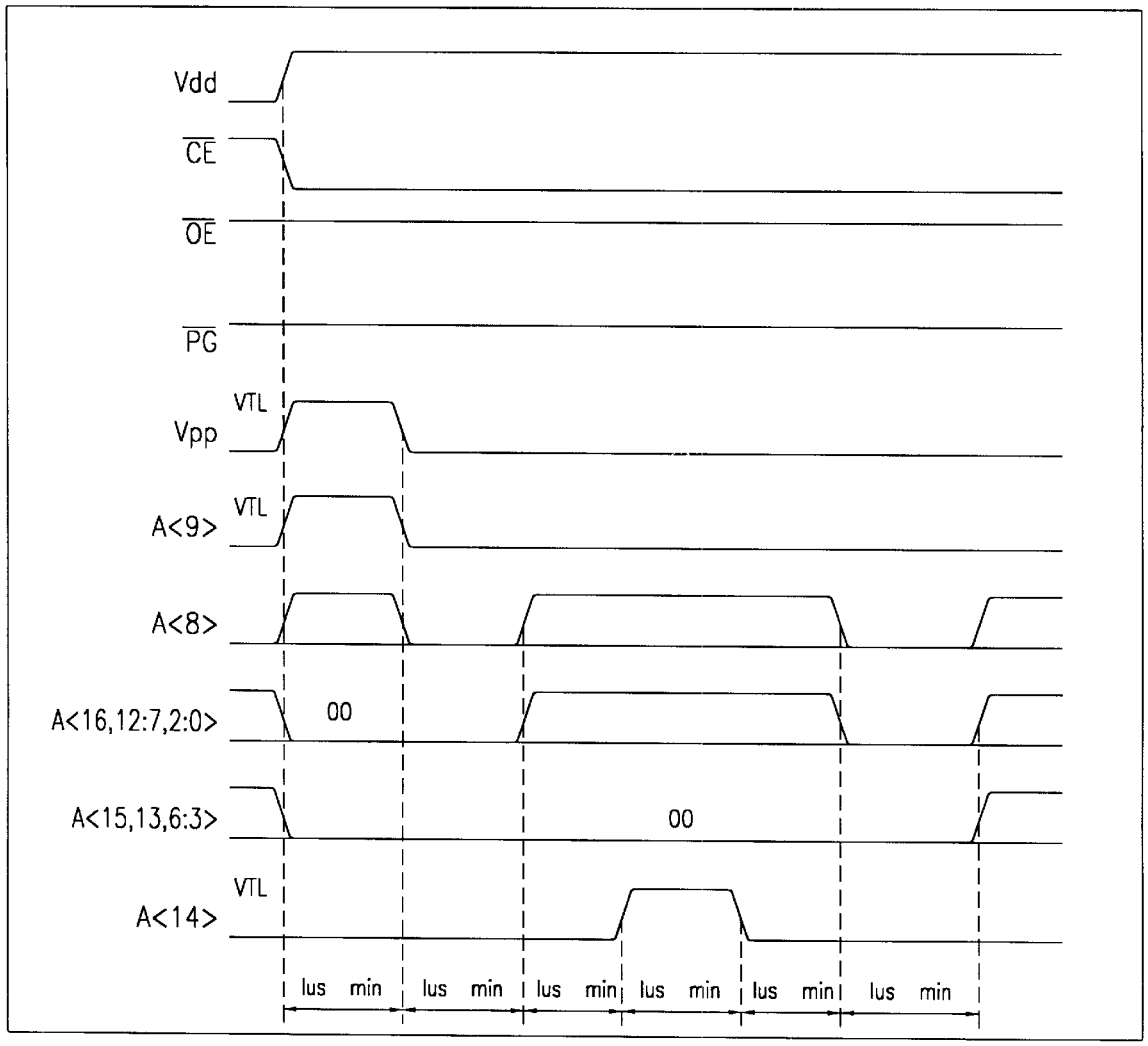
FIG. 3 is a timing diagram showing a plurality of different logic signals having the same time base and which are outstanding during the setting up phase of the timing trimming of a memory device according to the present invention.

An example of a possible coding latch according to the invention is shown in FIG. 3. The row addresses A16, A12–A7 as well as the column addresses A2–A0 identify a latch memory portion including a specific code for a different timing trimming.

Figure 4:
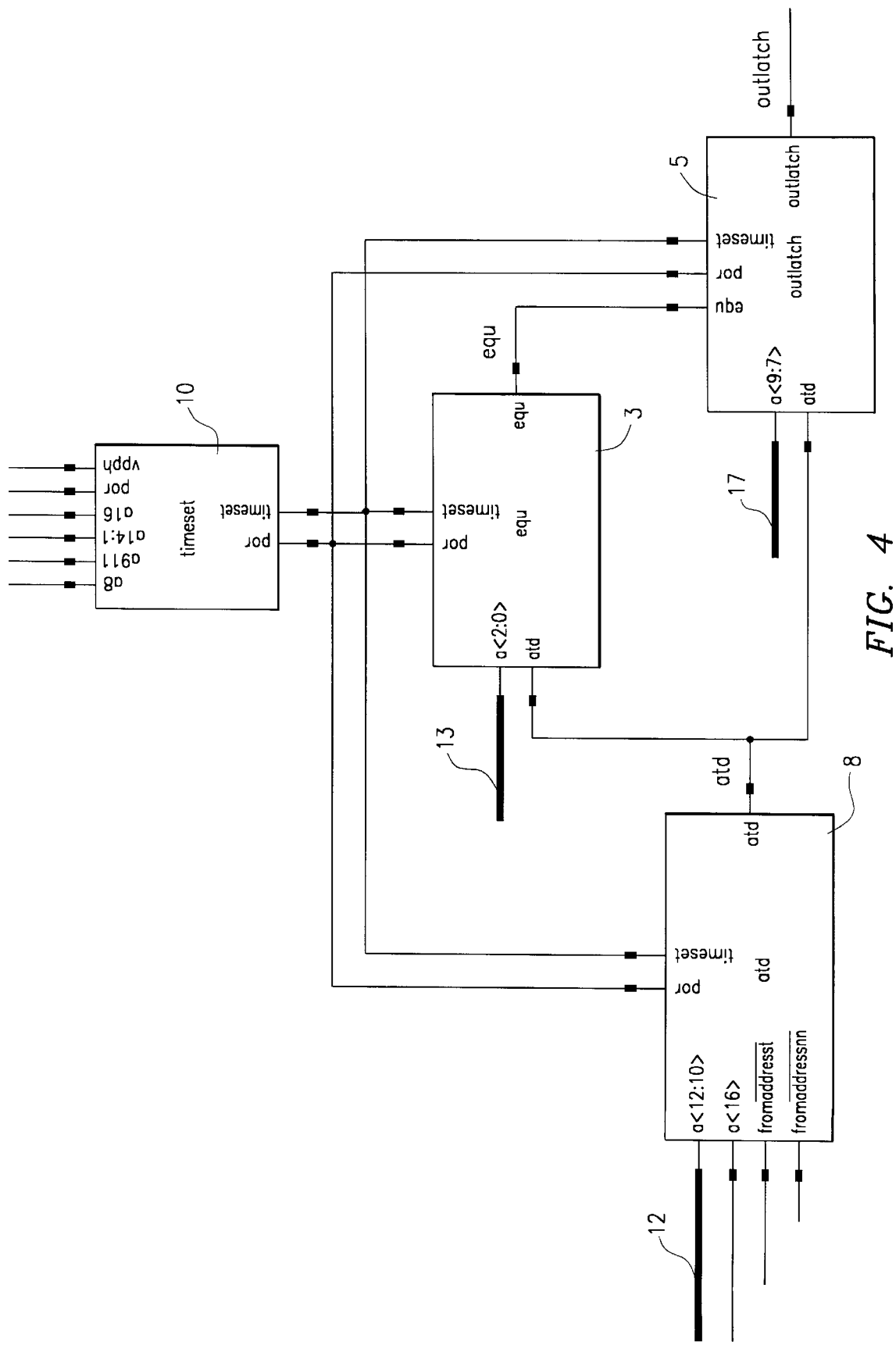
Figure 8:
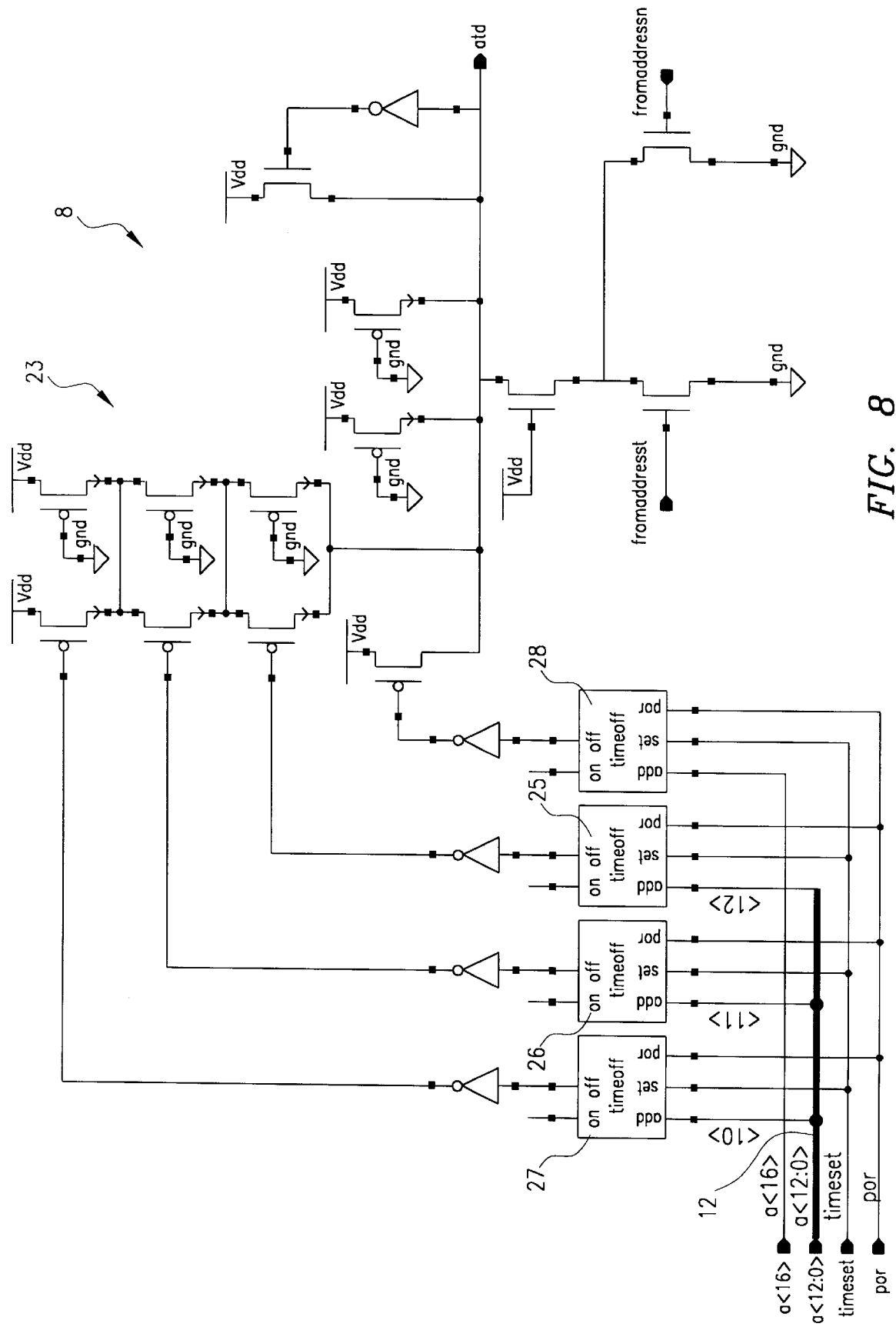

A latch coding 12 is represented in FIG. 4 to indicate a three bit code to trim the length of the ATD pulse. The structure of the latch coding 12 is shown in FIG. 8 wherein a set of four flip-flop TIMEOFF blocks is provided for receiving a respective address input signal A12, A11, A10 and to store a three bits code for a coarse trimming of the ATD signal. The fourth flip-flop receiving the address input signal A16 is provided for a finer trimming. A latch coding 13 is also shown in FIG. 4 to indicate a three bit code to trim the length of the equalization signal EQU. A further latch coding 17 is shown in FIG. 4 to indicate a three bit code to trim the length of the OUTLATCH signal. Each latch structure contains a code which is used to define a different length of the corresponding timing signal.

The following table 1 reports a possible example of address division for a 1 Mbit memory device in order to trim and set the internal timing of the semiconductor memory.

TABLE 1

| TRIMMING | ADDRESSES | No. of STEPS |
|---|---|---|
| $T_{ATD}$ 11 | A16 (fine) | 2 (0–1) |
|  | A12–A10 (coarse) | 8 (0–7) |
| $T_{EQU}$ | A2–AO | 8 (0–7) |
| $T_{EVAL}$ | A9–A7 | 8 (0–7) | where No. of steps means the number of possible timing combinations and $T_{EVAL}$ is the time interval between the end of the EQU signal and the end of the OUTLATCH signal.

Circuit portions of a circuit according to the present invention are shown in FIGS. 5 6, 7 and 8. Each circuit portion includes a transistor array in which the transistors are serially and/or parallel connected.

The transistor array represent an equivalent resistance R and, if we consider such a resistance R in association with a predetermined and fixed load capacitance C of the whole circuit, a variable RC circuit is defined according to the different series or parallel possible configurations of the transistor array. In other words, by varying the resistance R of the transistor array a corresponding variable RC circuit is obtained as well as a different circuit timing.

For instance, a small array 20 of P-Channel MOS transistors is used to change the timing of the OUTLATCH signal. Those PMOS transistors are shown in FIG. 7 and are interconnected in a mixed parallel-series configuration between a first supply voltage, reference Vdd and a ground GND.

Figure 7:
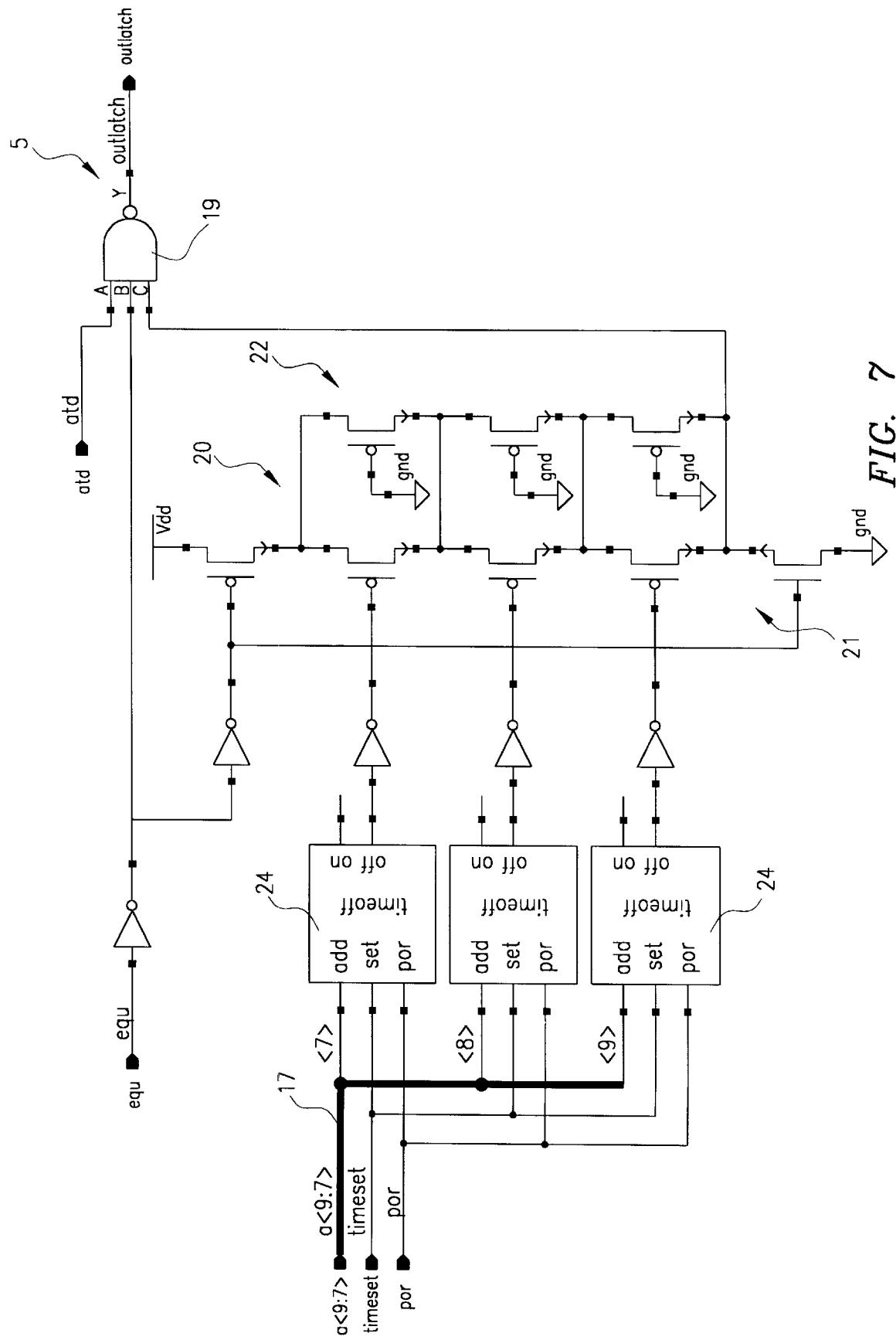

FIG. 7 shows a detailed schematic of the inside structure of the OUTLATCH generator 5. A final logic gate 19 receives as inputs the EQU signal, the ATD signal and a further signal coming out from the transistor array structure 20. The transistor array structure 20 includes a first stage 21 and a second stage 22. More specifically, with 21 is indicated a first series or chain of PMOS transistors which is connected in parallel to a second chain 22 of other PMOS transistors having their gate terminals connected to ground.

The first and second chains 21, 22 have different dimensions and set up the equivalent resistance R of the transistor array 20. The first chain 21 comprises five transistors serially connected. The three central transistors of this series receive an inverted signal on their gate terminals coming from the OFF output of a corresponding TIMEOFF circuit block 24. The blocks 24 are flip-flops which form a latch structure receiving as input a bit of the latch coding 17, and the signals POR and TimeSet.

According to the address input signals A9, A8, A7, and to the resistance R value determined by the transistor array 20, the timing of the OUTLATCH signal may be determined according of the user needs.

A similar transistor array structure is included also in the ATD generator 8 shown in FIG. 8. The detailed structure of the ATD generator 8 is shown in FIG. 8.

As may be appreciated, a latch structure comprising four flip-flop TIMEOFF blocks 25, 26, 27, 28 is provided for receiving a respective address input signal 12, including address input signals A12, A11, A10, and to store a three-bit code for a coarse trimming of the ATD signal. The fourth flip-flop 28 receiving the address input signal A16 is provided for a finer trimming. A transistor array structure 23, similar to the transistors array 20 of FIG. 7, is used to trim the timing or the ATD signal.

Referring back to FIG. 4, a schematic view of a circuit according to the present invention is shown for setting up the best timing conditions for the memory device 1. A time generator 10 is provided inside the memory device 1 and comprises a plurality of inputs to receive a logic signal from the memory device, as well as the Power On Reset signal, and to generate as an output a TimeSet signal and a second Signal POR. Those output signals of the time generator 10 are also applied as inputs of the other circuit portions 8, 3 and 5 of the memory device 1.

More specifically, the ATD generator 8 receives as inputs said outputs of the time generator 10 and the logic values contained in the latch coding 12, that is the code contained in the row addresses A12–A10 of the memory device 1.

The logic value (one bit) contained in the row position A16 is also addressed as input of the ATD generator 8.

The ATD generator 8 output is connected to an input of the generator 3 of the equalization signal EQU. This generator 3, according to the invention, receives also as input the logic code 13 contained in the memory column position A2–A0.

The output signal TIMESET of the time generator 10 is also applied to the EQU generator 3. The output of the ATD generator 8 and the output of the EQU generator 3 are applied as inputs of the OUTLATCH generator 5, which receives as well the output signal TIMESET of the time generator 10. A further input of the OUTLATCH generator 5 is the coding 17 contained in the cells of the memory row A9–A7 which included the three bits for trimming the length of the OUTLATCH output signal.

The detailed structure of the time generator 10 is shown in FIGS. 5, 5A and 5B. As may be appreciated, the time generator 10 is formed by a chain of logic gates which are interconnected to reduce the six inputs of the generator 10 to its output.

A simplified schematic of the circuit structure shown in FIGS. 5A and 5B is reported in FIG. 5C.

Figure 6:
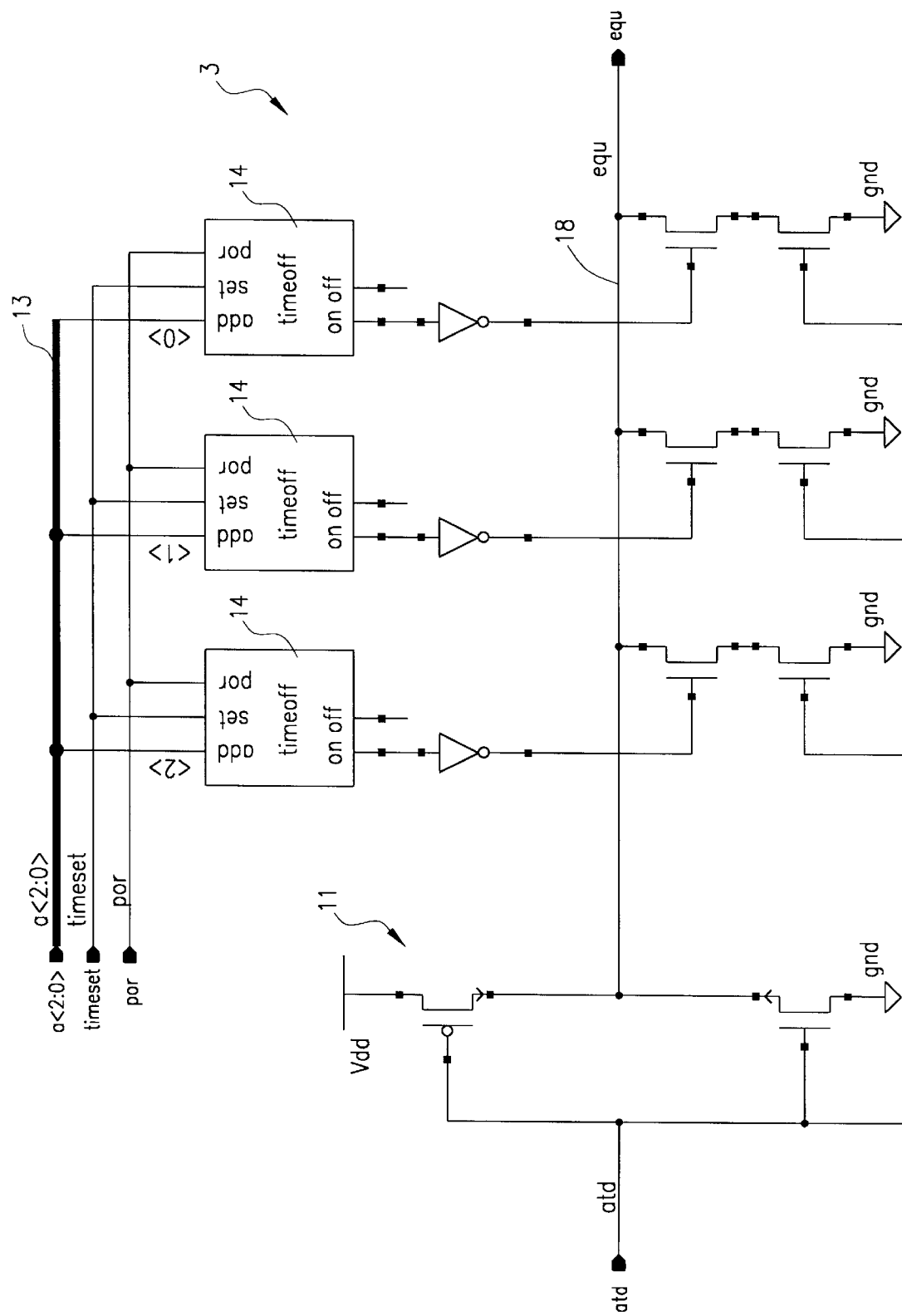

The inside structure of the EQU generator 3 is shown in FIG. 6. The ATD signal coming from the output of the ATD generator 8 is applied to a CMOS buffer 11 and to the gate terminals of a plurality of NMOS transistors which connect toward ground GND an EQU output line 18. In this respect, each NMOS transistor cooperates with a corresponding NMOS transistor connected in series and receiving on its gate terminal a signal coming from the ON output of a TIMEOFF circuit block 14.

Each circuit block 14 is part of a latch structure which receives as input the bits of the latch coding 13 and the enable signals POR and TIMESET. The latch receives a combination of the address input signals A2, A1, A0.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A method for controlling the internal timing conditions for a semiconductor memory device including a memory matrix, said method comprising the steps of:

detecting each transition of a plurality of address terminals of the semiconductor memory device;

generating an address transition detection (ATD) synchronization signal in response to the transition detecting;

generating an equalization (EOU) signal activated by said ATD signal;

generating an OUTLATCH signal activated by said ATD signal and said EQU signal to enable an output buffer circuitry of the semiconductor memory device; and automatically trimming the timing of said ATD, EQU and OUTLATCH signals according to a corresponding code contained in said semiconductor memory device.

2. The method according to claim 1, wherein the timing of said ATD, EQU and OUTLATCH signals are each regulated by a distinct transistor array having a variable equivalent resistance controlled by the corresponding code.

3. A circuit for detecting the optimal timing conditions for a semiconductor memory device which comprises a memory matrix, a plurality of address input signals and circuit portions for allowing reading of the data stored in the memory matrix, the circuit comprising:

an address transition detection (ATD) generator detecting each transition of a plurality of address input signals of the semiconductor memory device to produce an ATD synchronization signal;

an equalization generator activated by said ATD synchronization signal for generating an equalization signal for equalizing a sense amplifier in the semiconductor memory device;

an enabling generator receiving said ATD signal and generating an enable signal for enabling an output buffer circuitry of the semiconductor memory device; and wherein said semiconductor memory device includes a latch configured to store timing data therein representing one or more pulse width values for programmably trimming the ATD, equalization and enable signals.

4. The circuit according to claim 3, wherein said latch includes an array of flip-flops, each of which receives an address input signal corresponding to a distinct circuit portion of the memory device.

5. A device for controlling control signals internal to a semiconductor memory device having input address terminals, a memory array and an output buffer, comprising:

detecting circuitry for detecting an edge transition appearing on at least one of the input address terminals; and address pulse circuitry for generating an address transition detection (ATD) pulse signal responsive to the detecting circuitry, a pulse width of the ATD pulse signal being programmable.

6. The device of claim 5, further including:

conditioning pulse circuitry for generating a conditioning pulse signal for conditioning circuitry associated with a bit line in the memory array, a pulse width of the conditioning pulse signal being programmable.

7. The device of claim 6, wherein:

the conditioning pulse circuitry is responsive to the address pulse circuitry.

8. The device of claim 6, further including:

enable pulse circuitry for generating an enable pulse signal for enabling the output buffer of the semiconductor memory device, a pulse width of the enable pulse signal being programmable.

9. The device of claim 8, wherein:

the enable pulse circuitry is responsive to the conditioning pulse circuitry.

10. The device of claim 8, further including:

storage circuitry for storing a plurality of codes, each code corresponding to a distinct one of the address pulse circuitry, the conditioning pulse circuitry and the enable pulse circuitry for determining a pulse width generated thereby.

11. The device of claim 10, wherein:

the address pulse circuitry, the conditioning pulse circuitry and the enable pulse circuitry each includes a transistor array; and transistors in each transistor array are activated based upon the code corresponding thereto.

12. A circuit for controlling the generation of control signals internal to a semiconductor memory device having a plurality of address input signals, comprising:

first circuitry for storing one or more codes in the semiconductor memory device;

second circuitry for detecting an edge transition appearing on one or more of the address input signals; and third circuitry, responsive to the second circuitry, for generating an address transition detect (ATD) pulse signal, timing characteristics of the ATD pulse being based upon the one or more codes stored by the first circuitry.

13. The circuit of claim 12, wherein:

a timing delay between the detection of the address input signal edge transition and an edge of the ATD pulse signal is based upon a first code stored by the first circuitry.

14. The circuit of claim 13, wherein:

at least one first code signal corresponding to the first code drives a control electrode of at least one transistor within the third circuitry for effecting an edge transition delay of the ATD pulse signal.

15. The circuit of claim 12, further including:

fourth circuitry, responsive to the third circuitry, for generating a conditioning pulse signal for conditioning at least one bit line in the memory array, timing characteristics of the conditioning pulse signal being based upon the one or more stored codes.

16. The circuit of claim 15, wherein:

the third circuitry generates the ATD pulse signal having a leading edge and a trailing edge; and the fourth circuitry generates the conditioning pulse signal having a leading edge and a trailing edge, wherein the timing delay between the trailing edge of the ATD pulse signal and the trailing edge of the conditioning pulse signal is based upon a first code stored by the first circuitry.

17. The circuit of claim 15, further including:

fifth circuitry, responsive to the fourth circuitry, for generating an enable pulse signal for enabling output buffer circuitry of the semiconductor memory device, timing characteristics of the enable pulse signal being based upon the one or more stored codes.

18. The circuit of claim 17, wherein:

the fourth circuitry generates the conditioning pulse signal having a leading edge and a trailing edge;

the fifth circuitry generates the enable pulse signal having a leading edge and a trailing edge, wherein the timing delay between the trailing edge of the conditioning pulse signal and the trailing edge of the enable pulse signal is based upon a first code stored by the first circuitry.

19. The circuit of claim 17, wherein:

the third circuitry, fourth circuitry and fifth circuitry each includes a transistor array; and the first circuitry stores a plurality of codes in the semiconductor memory device, each code activating transistors of a distinct transistor array for effecting an edge transition time of the output thereof.

20. A method of controlling the generation of control signals internal to a semiconductor memory device, comprising the steps of:

storing one or more codes in the semiconductor memory device;

detecting an edge transition appearing on one or more address input signals; and generating an address transition detect (ATD) pulse signal, timing characteristics of the ATD pulse being based upon the one or more codes stored in the step of storing.

21. The method of claim 20, wherein:

the generating step includes the step of delaying the generation of an edge of the ATD pulse signal by an amount that is based upon a code stored during the step of storing.

22. The method of claim 20, further including the step of:

generating a conditioning pulse signal for conditioning at least one bit line in the semiconductor memory device, based upon the one or more codes stored during the step of storing.

23. The method of claim 20, wherein:

the step of generating the conditioning pulse signal includes the step of delaying the generation of an edge of the conditioning pulse signal relative to the generation of a corresponding edge of the ATD pulse signal by an amount that is based upon the one or more codes stored during the step of storing.

24. The method of claim 22, further including the step of:

generating an enable pulse signal for enabling an output buffer in the semiconductor memory device, based upon the one or more codes stored during the step of storing.

25. The method of claim 24, wherein:

the step of generating the enable pulse signal includes the step of delaying the generation of an edge of the enable pulse signal relative to the generation of a corresponding edge of the conditioning pulse signal by an amount that is based upon the one or more codes stored during the step of storing.

26. The method of claim 24, wherein:

the step of storing comprises the step of individually storing a plurality of codes in the semiconductor memory device, each code indicating a timing delay utilized during the generation of a distinct one of the ATD pulse signal, the conditioning pulse signal and the enable pulse signal.

27. The method of claim 20, further comprising the steps of:

replacing the stored one or more codes in the semiconductor memory device with one or more replacement codes; and repeating the step of generating the ATD pulse signal, timing characteristics of the ATD pulse signal being based upon the one or more replacement codes.

* * * * *

UNITED STATES PATENT AND TRADEMARK OFFICE
CERTIFICATE OF CORRECTION

PATENT NO. : 6,009,041
DATED : December 28, 1999
INVENTOR(S) : Paolo Rolandi et al.

It is certified that error appears in the above-identified patent and that said Letters Patent is hereby corrected as shown below:

Column 6,
Line 5, replace "(EOU)" with -- (EQU) --
Line 62, replace "signal for enabling the" with -- signal for enabling an --

Column 7,
Line 29, delete "signal"

Signed and Sealed this

Twenty-ninth Day of July, 2003

JAMES E. ROGAN
*Director of the United States Patent and Trademark Office*